United States Patent
Hayashi et al.

(10) Patent No.: US 10,716,218 B2
(45) Date of Patent: Jul. 14, 2020

(54) DISPLAY DEVICE AND METHOD FOR MANUFACTURING THE SAME

(71) Applicants: Masami Hayashi, Kumamoto (JP); Kenichi Miyamoto, Kumamoto (JP); Nobuaki Ishiga, Kumamoto (JP); Kensuke Nagayama, Kumamoto (JP); Naoki Tsumura, Kumamoto (JP)

(72) Inventors: Masami Hayashi, Kumamoto (JP); Kenichi Miyamoto, Kumamoto (JP); Nobuaki Ishiga, Kumamoto (JP); Kensuke Nagayama, Kumamoto (JP); Naoki Tsumura, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 695 days.

(21) Appl. No.: 13/791,655

(22) Filed: Mar. 8, 2013

(65) Prior Publication Data
US 2013/0278549 A1 Oct. 24, 2013

(30) Foreign Application Priority Data
Apr. 18, 2012 (JP) ................. 2012-094549

(51) Int. Cl.
*H05K 3/06* (2006.01)
*G06F 3/041* (2006.01)
*H05K 1/09* (2006.01)
*G06F 3/044* (2006.01)

(52) U.S. Cl.
CPC ............ *H05K 3/061* (2013.01); *G06F 3/044* (2013.01); *G06F 3/0412* (2013.01); *H05K 1/09* (2013.01); *G06F 2203/04103* (2013.01)

(58) Field of Classification Search
CPC .. H05K 3/06; H05K 1/09; G06F 3/041; G06F 3/0412
See application file for complete search history.

(56) References Cited

U.S. PATENT DOCUMENTS

| | | | |
|---|---|---|---|
| 6,768,581 B1 | 7/2004 | Yip et al. | |
| 8,159,749 B2 * | 4/2012 | Inoue et al. | ............ 359/589 |
| 8,405,629 B2 | 3/2013 | Reinfried et al. | |
| 2003/0146693 A1 * | 8/2003 | Ishihara | ........ H01L 27/3276 313/504 |

(Continued)

FOREIGN PATENT DOCUMENTS

| | | |
|---|---|---|
| JP | 2010-079240 A | 4/2010 |
| JP | 2010-097536 A | 4/2010 |

(Continued)

OTHER PUBLICATIONS

An Office Action; "Notice of Reason for Rejection," issued by the Japanese Patent Office dated Jan. 5, 2016, which corresponds to Japanese Patent Application No. 2012-094549 and is related to U.S. Appl. No. 13/791,655; with English language partial translation.

*Primary Examiner* — Anthony J Frost
(74) *Attorney, Agent, or Firm* — Studebaker & Brackett PC

(57) ABSTRACT

A display device is provided with a laminated wiring including a low-resistance conductive film, a low-reflection film mainly containing Al and functioning as a reflection preventing film, and a cap film which are sequentially laminated on a transparent substrate, and an insulting film formed so as to cover the laminated wiring.

9 Claims, 12 Drawing Sheets

(56) References Cited

U.S. PATENT DOCUMENTS

| | | |
|---|---|---|
| 2007/0030569 A1 | 2/2007 | Lu et al. |
| 2008/0121903 A1* | 5/2008 | Hiramatsu .......... H01L 21/0237 257/89 |
| 2011/0199341 A1* | 8/2011 | Reinfried ................ G06F 3/044 345/176 |
| 2011/0279403 A1* | 11/2011 | Lee ........................ G06F 3/044 345/174 |
| 2012/0241199 A1 | 9/2012 | Kobayashi et al. |

FOREIGN PATENT DOCUMENTS

| | | |
|---|---|---|
| JP | 2011-165191 A | 8/2011 |
| JP | 2011-175900 A | 9/2011 |
| WO | 2011/070801 A1 | 6/2011 |
| WO | 2011/143861 A1 | 11/2011 |

* cited by examiner

DISPLAY DEVICE AND METHOD FOR MANUFACTURING THE SAME

BACKGROUND OF THE INVENTION

Field of the Invention

The present invention relates to a display device and a method for manufacturing the same and, more particularly, it is an object of the present invention to provide a display device suitable for being used outdoors.

Description of the Background Art

As for a display device used outdoors, preferable display characteristics are required in an environment in which an amount of incident light from an outside of the display device is large such as a case where it is used under sunlight. Meanwhile, a wiring of the display device is required to be low in resistance and easily processed, so that an aluminum (Al) alloy is increasingly used as a metal which satisfies the above requirement.

However, the aluminum alloy is high in reflectivity, so that the problem is that incident light reflects on an aluminum alloy wiring, in the environment in which the amount of the incident light from the outside of the display device is large, so that preferable display characteristics cannot be obtained.

In order to reduce the reflection of light inputted from a display surface, it is proposed that a reflection preventing film is arranged on the aluminum alloy wiring, and, for example, Japanese Patent Application Laid-Open No. 2010-79240 discloses a reflection preventing film including an aluminum film and an aluminum nitride film.

The above patent document discloses that a reflectivity is reduced by increasing a degree of nitridation of the aluminum nitride film, and it may be said that the aluminum nitride film functions as the reflection preventing film.

SUMMARY OF THE INVENTION

Here, in the case where the aluminum nitride film is arranged on the aluminum alloy wiring as the reflection preventing film, the problem is that the aluminum nitride film is etched in an alkali treatment during a process, such as a treatment to remove a resist material with an alkali treatment liquid, and its film thickness is reduced, which causes an increase in reflectivity.

It is an object of the present invention to provide a method for manufacturing a display device in which a function of a reflection preventing film formed on a wiring surface is not damaged, and provide a display device superior in visibility of a display image even when used outdoors.

An aspect of a display device according to the present invention includes a laminated wiring including a conductive film, a metal nitride film mainly containing Al and functioning as a reflection preventing film, and a transparent film which are sequentially laminated on a base layer, and an insulating film formed so as to cover the laminated wiring, in which the insulating film side is a display surface side.

According to the above display device, since the transparent film is provided on the metal nitride film mainly containing Al and functioning as the reflection preventing film, the metal nitride film is prevented from being etched in an alkali treatment during a process and its film thickness is prevented from being reduced, so that the reflectivity is not increased and the function as the reflection preventing film is not damaged, and thus there can be provided a display device superior in visibility of a display image even when used outdoors.

An aspect of a method for manufacturing a display device according to the present invention includes (a) a step of sequentially forming a conductive film, a metal nitride film mainly containing Al and functioning as a reflection preventing film, and a cap film, on a base layer, (b) a step of forming a resist mask having a predetermined pattern, on the cap film, (c) a step of patterning the cap film, the metal nitride film, and the conductive film by etching, with the resist mask used as an etching mask, and (d) a step of removing the resist mask after step (c), in which the predetermined pattern includes a wiring pattern, and a laminated wiring includes at least the metal nitride film and the conductive film patterned with the wiring pattern.

According to the method for manufacturing a display device, since the cap film is provided on the metal nitride film mainly containing Al and functioning as the reflection preventing film, the metal nitride film is not etched in an alkali treatment performed when the resist mask is removed, so that its film thickness is not reduced and its reflectivity is not increased, whereby the function as the reflection preventing film can be prevented from being damaged.

These and other objects, features, aspects and advantages of the present invention will become more apparent from the following detailed description of the present invention when taken in conjunction with the accompanying drawings.

DESCRIPTION OF THE PREFERRED EMBODIMENTS

Entire Configuration of Display Device

Figure 1:
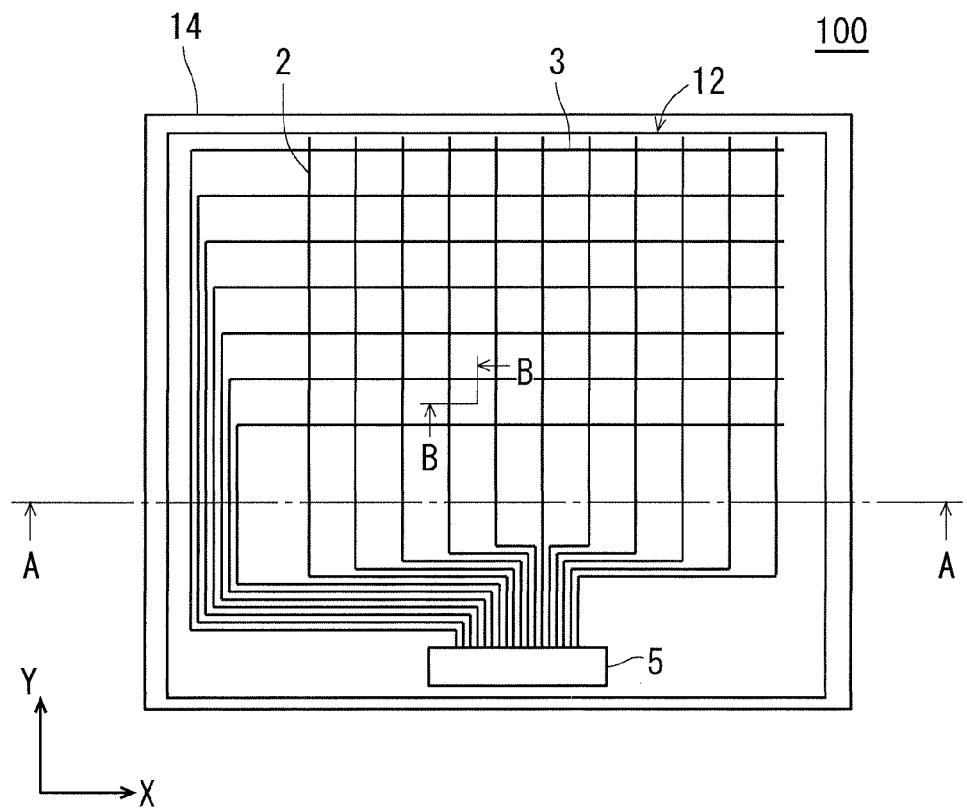
FIG. 1 is a plan view showing an entire configuration of a display device according to the present invention.
Figure 2:
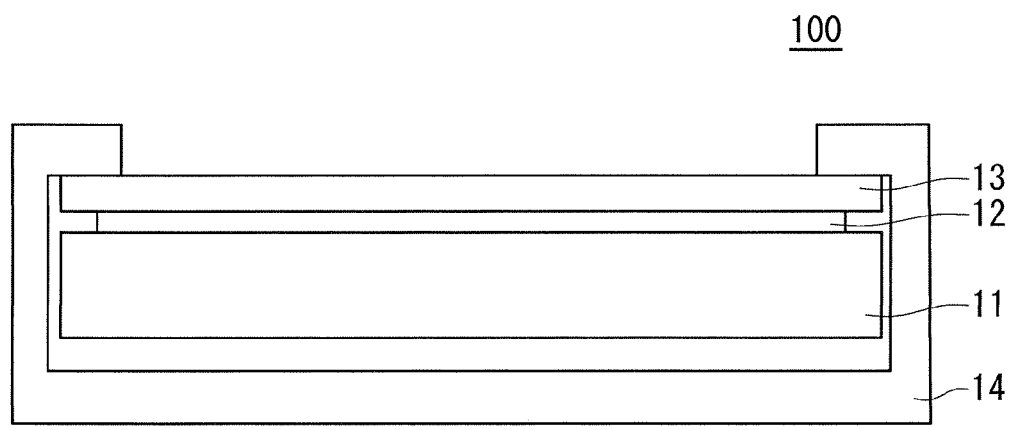
FIG. 2 is a cross-sectional view of the display device according to the present invention.

FIG. 1 is a plan view showing an entire configuration of a display device 100 according to the present invention, and FIG. 2 is a cross-sectional view taken along a line A-A in FIG. 1.

The display device 100 shown in FIG. 1 and FIG. 2 has a configuration capable of inputting data through a touch panel on the assumption that it is used outdoors, and has a pointing function with a finger and the like.

As shown in FIG. 2, the display device 100 is provided with a display module 11 such as a liquid crystal display, a touch panel 12 arranged on a display surface of the display module 11, a protective glass 13 for protecting a surface of the touch panel 12 from being damaged, and a casing 14 for housing those components. When the touch panel 12 and the display module serving as a graphical user interface (GUI) device are combined and used, the display device can have the pointing function.

The touch panel 12 is a projected capacitive touch panel having matrix wirings including X position detecting wirings 2 arranged on a transparent substrate consists of glass or polyethylene terephthalate (PET) so as to extend in a column direction (Y direction in FIG. 1), and Y position detecting wirings 3 arranged above the X position detecting wirings 2 so as to extend in a row direction (X direction in FIG. 1) and intersect with the X position detecting wirings 2 in a three-dimensional manner.

As shown in FIG. 1, the X position detecting wirings 2 and the Y position detecting wirings 3 are electrically connected to a terminal 5 provided at an edge of the touch panel 12 so as to externally input or output a signal, through lead-out wirings 4, so that the touch panel 12 is electrically connected to a control substrate (not shown) through the terminal 5.

In addition, a description will be given assuming that the X position detecting wiring 2 serves as a lower layer wiring (provided on the transparent substrate), and the Y position detecting wiring 3 serves as an upper layer wiring in the following preferred embodiment, but they may be reversely arranged.

First Preferred Embodiment

Figure 3:
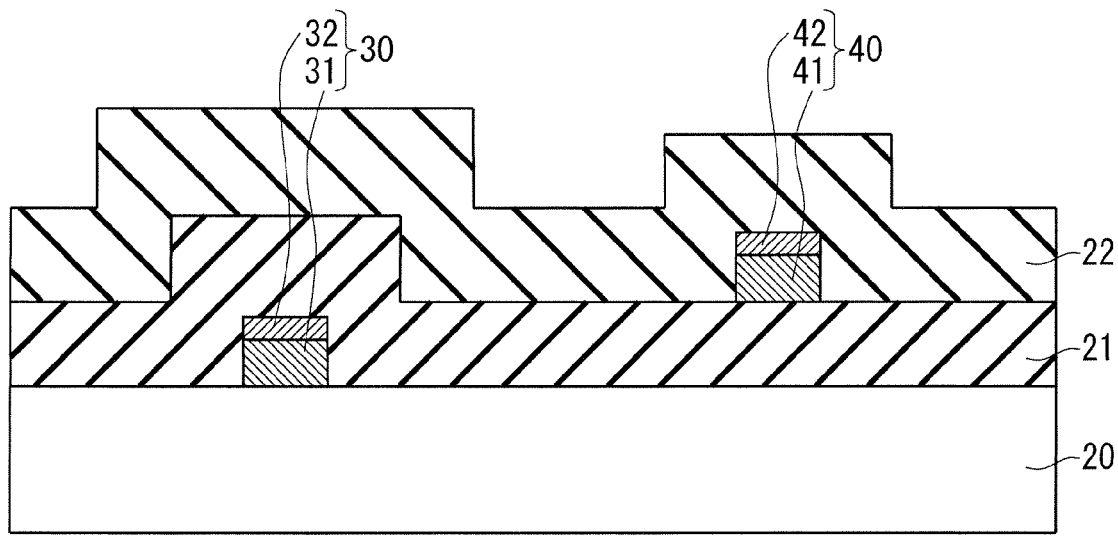
FIG. 3 is a cross-sectional view of a touch panel of the display device according to the present invention.

Hereinafter, a first preferred embodiment according to the present invention will be described with reference to a cross-sectional configuration of the touch panel 12. FIG. 3 is a view showing a cross-sectional configuration of the touch panel 12 taken along a line B-B in FIG. 1.

As shown in FIG. 3, the touch panel 12 has a configuration in which a lower layer wiring 30 is provided as a laminated film including a low-resistance conductive film 31 as a lower layer, and a low-reflection film 32 as an upper layer, on a transparent substrate 20 consists of glass or PET, and an interlayer insulating film 21 is arranged so as to cover the lower layer wiring 30. The lower layer wiring 30 corresponds to the X position detecting wiring 2 shown in FIG. 1. In addition, the transparent substrate 20 serves as a base for forming the lower layer wiring 30, so that it is referred to as a base layer occasionally.

An upper layer wiring 40 provided with a laminated film including a low-resistance conductive film 41 as a lower layer and a low-reflection film 42 as an upper layer is arranged on the interlayer insulating film 21, and a protective film 22 is arranged so as to cover the upper layer wiring 40. The upper layer wiring 40 corresponds to the Y position detecting wiring 3 shown in FIG. 1. In addition, the interlayer insulating film 21 serves as a base for forming the upper layer wiring 40, so that it is referred to as a base layer occasionally.

The low-resistance conductive film 31 of the lower layer wiring 30 consists of an Al-based alloy serving as a low resistance material such as AlNiNd, and has a thickness of 300 nm, for example.

The low-reflection film 32 of the lower layer wiring 30 includes an aluminum (Al) nitride film having a high degree of nitridation in which a degree of nitridation is 30 at. % to 50 at. % (atomic %) as a composition ratio of nitrogen, and has a thickness of 50 nm, for example.

The interlayer insulating film 21 consists of $SiO_2$, and has a thickness of 600 nm, for example.

The low-resistance conductive film 41 of the upper layer wiring 40 consists of an Al-based alloy serving as a low resistance material such as AlNiNd, and has a thickness of 400 nm, for example.

The low-reflection film 42 of the upper layer wiring 40 includes an aluminum (Al) nitride film having a high degree of nitridation in which a degree of nitridation is 30 at. % to 50 at. % (atomic %) as a composition ratio of nitrogen, and has a thickness of 50 nm, for example.

In addition, reflectivity of the Al nitride film can be 50% or less by appropriately selecting the degree of nitridation from the condition of 30 at. % to 50 at. % as the composition ratio of nitrogen, and the reflectivity can be 30% or less by setting the degree of nitridation at about 45 at. % as the composition ratio of nitrogen. In addition, an optimal low-reflection film can be provided by adjusting its film thickness based on the degree of nitridation.

The protective film 22 consists of $SiO_2$, and has a thickness of 300 nm, for example.

In addition, the description has been given of the example in which the low-reflection films 32 and 42 consist of AlN in the above, but they may consist of metal (metal nitride) which is provided by nitriding an Al-based alloy mainly containing Al and also containing another metal, without limitation. Examples of another metal include Fe, Co, and Ni as group 8 transition metals, and Nd as a rare earth element.

Furthermore, the upper layer wiring 40 serving as the Y position detecting wiring 3 is longer than the lower layer wiring 30 in the above, so that the low-resistance conductive film 41 is thicker than the low-resistance conductive film 31 in order to reduce wiring resistance, but the film thicknesses of the conductive films of the lower layer wiring 30 and the upper layer wiring 40 may be arbitrarily determined based on required resistance.

In addition, the description has been given of the case where the low-resistance conductive films 31 and 41 consist of an Al-based alloy, but they may consist of Ag, without limitation.

In addition, a variation in reflection distribution of the low-reflection films 32 and 42 can be reduced by keeping their film thickness distribution so as to set film thicknesses at the time of completion of the process to the extent that a minimum film thickness/a maximum film thickness>about 0.6.

The film thickness of the interlayer insulating film 21 may be arbitrarily determined based on desired electrostatic capacity, and the film thickness of the protective film 22 may be determined based on etching selectivity with respect to a resist film and a process time at the time of a dry etching process, but when the thickness is large, differences in color and reflectivity from the lower layer wiring 30 can be small in many cases, so that the thickness may be set at about 1 μm, preferably set at 1.3 μm or more.

Next, a method for manufacturing the display device of the first preferred embodiment according to the preset invention will be described, with reference to FIG. 4 to FIG. 10 sequentially showing steps of manufacturing the touch panel 12.

Figure 4:
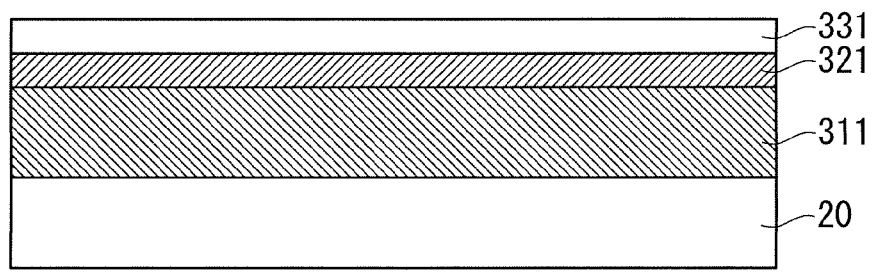
FIG. 4 to FIG. 10 are cross-sectional views for describing steps of manufacturing a touch panel of a first preferred embodiment according to the present invention.

First, in a step shown in FIG. 4, an AlNiNd film 311 having a thickness of 300 nm is formed with an AlNiNd target, on the transparent substrate 20 consists of glass or PET, by a sputtering method. Then, in the same film forming equipment, an Al nitride alloy film 321 having a high degree of nitridation and a thickness of 50 nm is formed with an AlNiNd target, on the AlNiNd film 311 in an atmosphere containing $N_2$ gas, by a sputtering method.

In addition, when the degree of nitridation of the Al nitride alloy film 321 is low, the film is a reflective film and the low-reflection film cannot be formed, on the contrary, when the degree of nitridation is high, the film is a transparent film and the low-reflection film cannot be formed, so that it is preferable to previously obtain a relationship between a $N_2$ partial pressure and reflection characteristics in the film forming equipment to be used, and determine a film formation condition so that a low-reflection film having a desired reflectivity can be provided.

Then, an amorphous indium tin oxide (ITO) film 331 is formed on the Al nitride alloy film 321 by a sputtering method. In addition, instead of a sputtering method, a method such as coating may be used.

Figure 5:
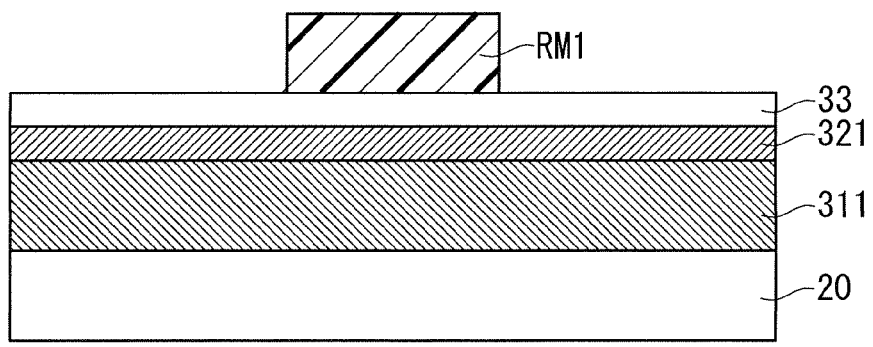

Then, a resist material is coated onto the ITO film 331, a pattern of the lower layer wiring is exposed and developed, and a resist mask RM1 for the lower layer wiring is patterned as shown in FIG. 5.

Figure 6:
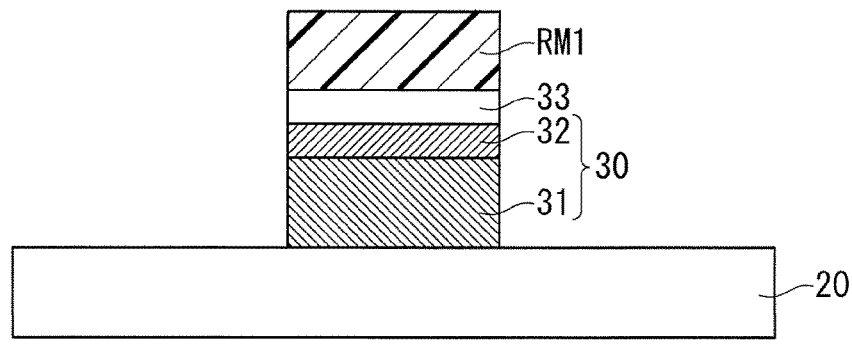

Then, as shown in FIG. 6, with the resist mask RM1 used as an etching mask, the ITO film 331 is etched with an oxalic acid solution to pattern the cap film 33. Then, with the resist mask RM1 and the cap film 33 used as etching masks, the Al nitride alloy film 321 and the AlNiNd film 311 are etched with a mixed acid of phosphoric acid, nitric acid, and acetic acid to pattern the low-reflection film 32 and the low-resistance conductive film 31, respectively.

In addition, in a case where the Al nitride alloy film 321 and the AlNiNd film 311 are etched at the same time, the degree of nitridation of the Al nitride alloy film 321 is to be set within the extent that the etching can be performed with the above-described mixed acid.

Figure 7:
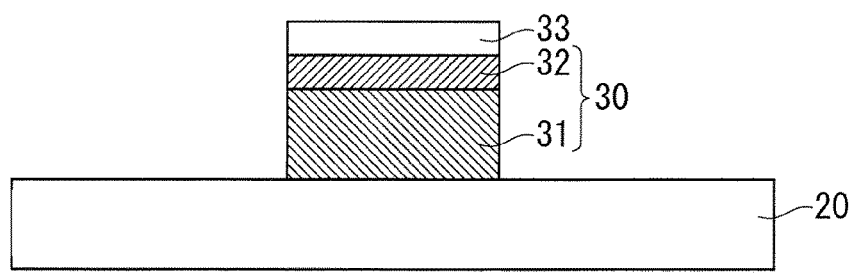
Figure 8:
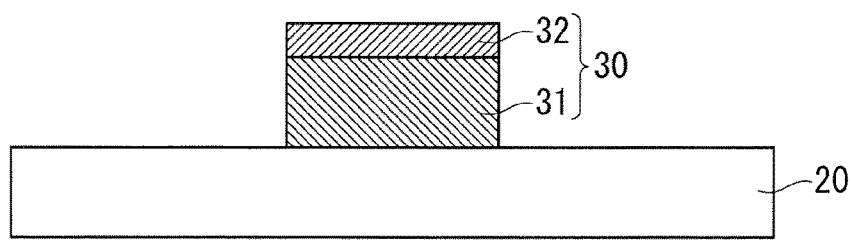

Then, as shown in FIG. 7, the resist mast RM1 is removed with a mixed liquid of monoethanolamine and dimethylsulfoxide, and then the cap film 33 is removed with, for example, an oxalic acid solution, whereby the lower layer wiring 30 is formed as shown in FIG. 8.

Figure 9:
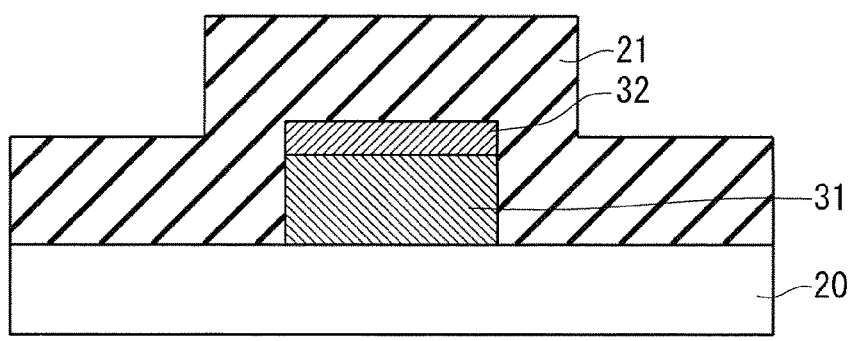

Then, as shown in FIG. 9, the interlayer insulating film 21 is formed by forming a $SiO_2$ film so as to cover the lower layer wiring 30 by a chemical vapor deposition (CVD) method.

Then, the upper layer wiring 40 is formed on the interlayer insulating film 21, but a description of its manufacturing steps is omitted because only a film thickness is different from that of the lower layer wiring 30.

After the upper layer wiring 40 is formed, the protective film 22 is formed by forming a $SiO_2$ film so as to cover the upper layer wiring 40 by a CVD method, for example.

Figure 10:
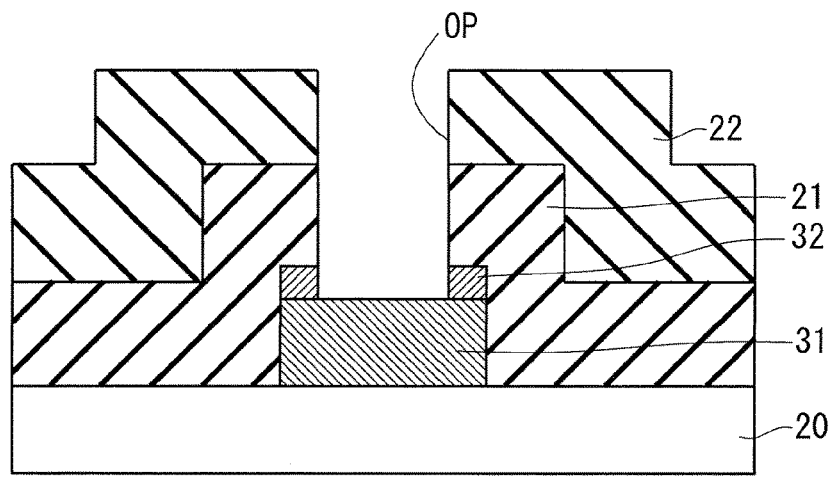

Then, as shown in FIG. 10, the interlayer insulating film 21 and the protective film 22 provided above the terminal 5 (FIG. 1) of the lower layer wiring 30 are removed, and furthermore, the low-reflection film 32 is removed, whereby an opening OP reaching the low-resistance conductive film 31 is formed. In addition, in the terminal 5 of the upper layer wiring 40, an opening reaching the low-resistance conductive film 41 is formed by removing the protective film 22 and the low-reflection film 42. Thus, the control substrate is electrically connected through this opening.

In addition, in a case where the interlayer insulating film 21 and the protective film 22 are removed by dry etching, the low-reflection film 32 (42) can also be removed by the same dry etching by increasing an etching time by a time required for etching the low-reflection film 32 (42). In addition, the interlayer insulating film 21 and the protective film 22 may be removed by dry etching and the low-reflection film 32 (42) may be removed by wet etching with an alkali liquid.

According to the above-described manufacturing method, since the cap film (serving as an etching protective film) is formed by the ITO film on the Al nitride alloy film serving as the low-reflection film, the Al nitride alloy film is prevented from being directly brought into contact with an alkali resist-removing liquid when the resist is removed with the resist-removing liquid, so that the Al nitride alloy film is not etched with the resist-removing liquid. As a result, its film thickness is not reduced, and its reflectivity is not increased, so that the function as the low-reflection film is prevented from being deteriorated or extinguished. Therefore, it becomes possible to stably provide a touch panel superior in visibility of a display image even when the touch panel has a low-reflection wiring pattern kept within a designed reflectivity range, and it is used outdoors.

<Variation>

The above description has been given of the case where the cap film includes the amorphous ITO film, but the present invention is not limited to this, and the cap film may consist of a material which can be removed without damaging the low-reflection film and the low-resistance conductive film when the cap film is removed. For example, when the cap film consists of amorphous indium zinc oxide (IZO), it can be removed with an oxalic acid-based liquid, and when the cap film consists of chrome (Cr), it can be removed with a ceric ammonium nitrate-based liquid. In either case, the low-reflection film and the low-resistance conductive film are not damaged.

In addition, the description has been given of the case where the Al nitride alloy film is etched with a mixed acid of phosphoric acid, nitric acid, and acetic acid, but it may be etched with an alkali liquid, or dry etching may be used.

In a case where the Al nitride alloy film is etched with a solution which cannot etch the low-resistance conductive film, the Al nitride alloy film can be formed with the high degree of nitridation as compared with the case where the above mixed acid is used, so that still lower reflection can be provided.

In addition, the description has been given of the case where the low-reflection film and the low-resistance conductive film are patterned with the resist mask, but in a case where the cap film consists of a material having a high etching selectivity with respect to the low-reflection film and the low-resistance conductive film, the resist mask may be removed after the cap film is patterned, and the low-reflection film and the low-resistance conductive film may be patterned with the patterned cap film used as the etching mask.

Furthermore, in a case where the cap film consists of a material having a high etching selectivity only with respect to the low-resistance conductive film, the resist mask may be removed after the low-reflection film is patterned, and the low-resistance conductive film may be patterned with the patterned cap film used as the etching mask.

Still furthermore, the description has been given of the case where the interlayer insulating film 21 and the protective film 22 consist of $SiO_2$, but they may consist of an insulating film which does not influence a color of transmitted light in a light transmitting part other than the wiring part, and for example, a coating type spin on glass (SOG) film may be used for that. In addition, when the SOG film is used as the interlayer insulating film 21, the upper layer wiring 40 can be prevented from being broken at the intersection with the lower layer wiring 30.

Second Preferred Embodiment

Figure 11:
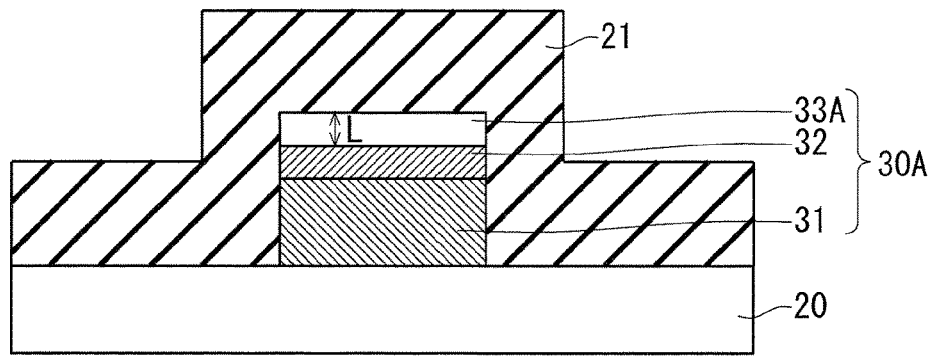
FIG. 11 and FIG. 12 are cross-sectional views showing a configuration of a lower layer wiring of a touch panel of a second preferred embodiment according to the present invention.

Next, a second preferred embodiment according to the present invention will be described with reference to FIG. 11 and FIG. 12. FIG. 11 is a cross-sectional view showing a configuration of the touch panel 12 after a lower layer wiring 30A and the interlayer insulating film 21 are formed.

As shown in FIG. 11, the lower layer wiring 30A includes a laminated film provided in such a manner that the low-resistance conductive film 31 is formed on the transparent substrate 20, the low-reflection film 32 is formed on the low-resistance conductive film 31, and a transparent cap film 33A is formed on the low-reflection film 32, and the interlayer insulating film 21 is formed so as to cover the lower layer wiring 30A.

The low-resistance conductive film 31 consists of AlNiNd, and has a thickness of 300 nm, for example. The low-reflection film 32 consists of an Al nitride alloy having a high degree of nitridation, and has a thickness of 50 nm, for example. In addition, the transparent cap film 33A consists of, for example, $SiO_2$.

According to a method for manufacturing the lower layer wiring 30A, a $SiO_2$ film is formed by a CVD method, instead of the ITO film 331 formed on the Al nitride alloy film 321 in the step described with reference to FIG. 4, in the manufacturing method of the first preferred embodiment described with reference to FIG. 4 to FIG. 10.

Then, a resist material is coated onto the $SiO_2$ film, a resist mask is patterned as described with reference to FIG. 4, and the $SiO_2$ film is etched by dry etching with the resist mask used as an etching mask to pattern the transparent cap film 33A. Then, the etching mask is removed, but the transparent cap film 33A is not removed, and the Al nitride alloy film 321 and the AlNiNd film 311 are etched with the transparent cap film 33A used as an etching mask to pattern the low-reflection film 32 and the low-resistance conductive film 31, respectively, whereby the lower layer wiring 30A is provided.

A $SiO_2$ film is formed so as to cover the lower layer wiring 30A, whereby the interlayer insulating film 21 is formed, and then the upper layer wiring is formed on the interlayer insulating film 21, but since the thickness only differs from the lower layer wiring 30A, a description of its manufacturing steps is omitted.

Figure 12:
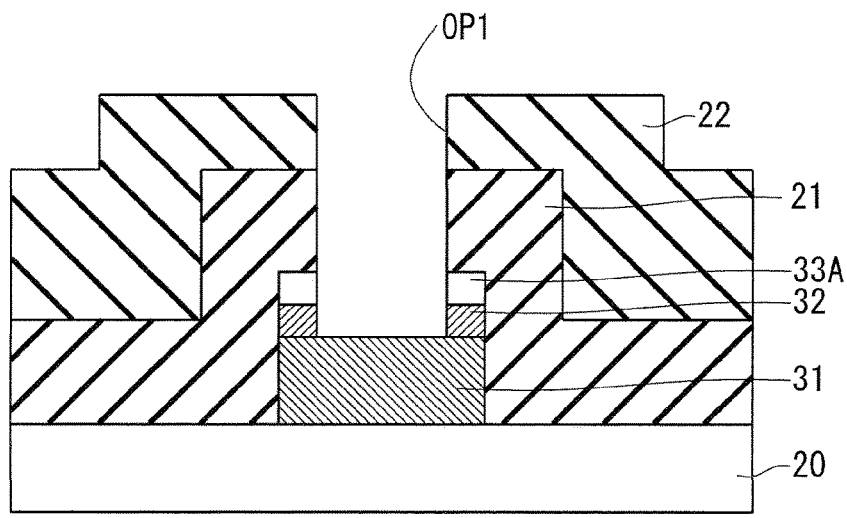

Then, as shown in FIG. 12, the interlayer insulating film 21 and the protective film 22 provided above the terminal 5 (FIG. 1) of the lower layer wiring 30A are removed, and furthermore, the transparent cap film 33A and the low-reflection film 32 provided there are removed, whereby an opening OP1 reaching the low-resistance conductive film 31 is formed. In addition, in a terminal of the upper layer wiring, an opening reaching the low-resistance conductive film is formed by removing the protective film and the low-reflection film.

Furthermore, in the case where the transparent cap film 33A consists of $SiO_2$, the Al nitride alloy film can also be etched at the same time as the transparent cap film 33A is patterned by dry etching. In this dry etching, for example, a mixed gas of $CF_4$ and $O_2$ is used. In this case, an etching time for the low-resistance conductive film can be reduced, so that the wiring obtained can be small in side etching amount.

Since the transparent cap film is not removed, the transparent cap film need not regard the etch selectivity with respect to the Al nitride alloy film and low-resistance conductive film, so that choices can be widened for a material of the transparent cap film and its process, and manufacturing costs can be reduced.

Furthermore, when the transparent cap film consists of a material having a refractive index of about 1.7 to 2.4 which is higher than that of the interlayer insulating film (protective film in the case of the upper layer wiring), and its film thickness is 30 nm to 70 nm, a light path length L is set to 0.05 μm to 0.17 μm, so that the reflectivity of the laminated wiring can be further lowered.

For example, when a $SiO_2$ film having a thickness of 1000 nm is formed as the interlayer insulating film on the laminated film of the Al nitride alloy film and the AlNiNd film, and a standard illuminant D65 is applied, reflected luminance Y is 15.0. Meanwhile, when an IZO film having a refractive index of 1.68 to 2.10 and a thickness of 50 nm is left as the transparent cap film on the low-reflection film, reflected luminance Y is 6.7. In addition, the standard illuminant D65 is a light source used when reflected luminance of a film is evaluated.

A well-known method for forming the low-reflection Al nitride film includes a sputtering method performed with a nitrogen-containing gas, and in this case, a reflectivity can be set based on a mixed ratio of nitrogen gas. However, as the mixed ratio of nitrogen gas is increased to lower the reflectivity, the degree of nitridation greatly varies in a plane of the low-reflection film, and an in-plane distribution of the reflectivity greatly varies. Therefore, in the case where degree of nitridation of the Al nitride film as the low-reflection film is increased, the degree of nitridation could greatly vary in the plane of the low-reflection film, and the reflectivity could greatly vary.

However, since each of the lower layer wiring and the upper layer wiring has the laminated structure including the transparent cap film, the degree of nitridation of the Al nitride film (and also the Al nitride alloy film) can be set low, so that the degree of nitridation is prevented from varying in the plane of the low-reflection film, and the reflectivity can be uniform in the low-reflection wiring. In addition, since the degree of nitridation can be set lower, the Al nitride film (and also the Al nitride alloy film) can be easily etched, and a stable process can be implemented.

In addition, the material of the transparent cap film having a refractive index of about 1.7 to 2.4 includes a transparent conductive film consists of IZO, ITO, SnO, ZnO, or InO, and a transparent dielectric film consists of SiN, $Al_2O_3$, transparent MN (composition ratio: 1:1), TaO, NbO or TiO.

In a case where the transparent cap film consists of a material which is difficult to form the opening in the terminal by etching, such as crystallized ITO, a step of removing the transparent cap film in the terminal before crystallization is to be added.

Meanwhile, in a case where the transparent cap film consists of a material which is easy to form the opening in the terminal by etching, the terminal can be formed without adding the step of removing the transparent cap film in the terminal, so that it is not necessary to add a photolithography process, and a manufacturing flow can be implemented at low costs.

Variation

In addition, the description has been given of the case where the lower layer wiring has the laminated structure including the transparent cap film, but the upper layer wiring may have the laminated structure including the transparent cap film, or each of the lower layer wiring and the upper layer wiring may have the laminated structure including the transparent cap film.

In addition, the description has been given of the case where the interlayer insulating film 21 and the protective film 22 consist of $SiO_2$, but they may include an insulating film which does not influence a color of transmitted light in a light transmitting part other than the wiring part, and for example, a coating type spin on glass (SOG) may be used. In addition, when the SOG film is used as the interlayer insulating film 21, the upper layer wiring can be prevented from being broken at the intersection with the lower layer wiring.

Third Preferred Embodiment

Figure 13:
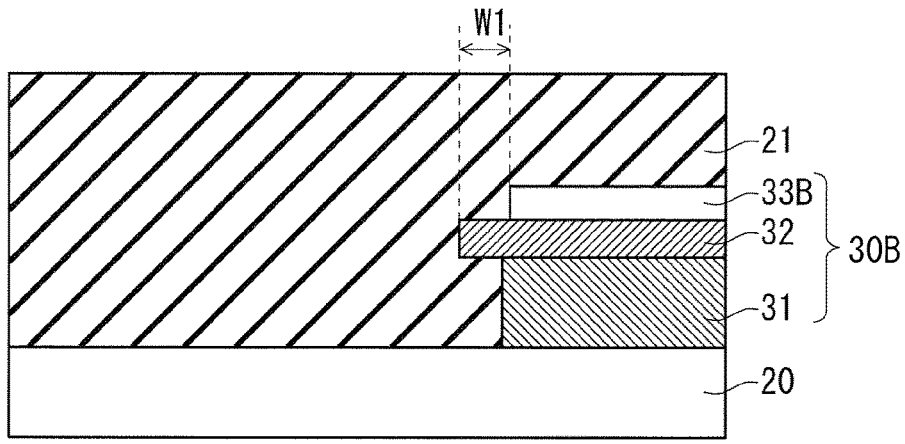
FIG. 13 and FIG. 14 are cross-sectional views showing a configuration of a lower layer wiring of a touch panel of a third preferred embodiment according to the present invention.

Next, a third preferred embodiment according to the present invention will be described with reference to FIG. 13 and FIG. 25. FIG. 13 is a cross-sectional view showing a configuration of the touch panel 12 after a lower layer wiring 30B and the interlayer insulating film 21 are formed, and FIG. 14 is a plan view showing the lower layer wiring 30B taken from a transparent cap film 33B.

As shown in FIG. 13, the lower layer wiring 30B includes a laminated film provided in such a manner that the low-resistance conductive film 31 is formed on the transparent substrate 20, the low-reflection film 32 is formed on the low-resistance conductive film 31, and the transparent cap film 33B is formed on the low-reflection film 32, and the interlayer insulating film 21 is formed so as to cover the lower layer wiring 30B.

Figure 14:
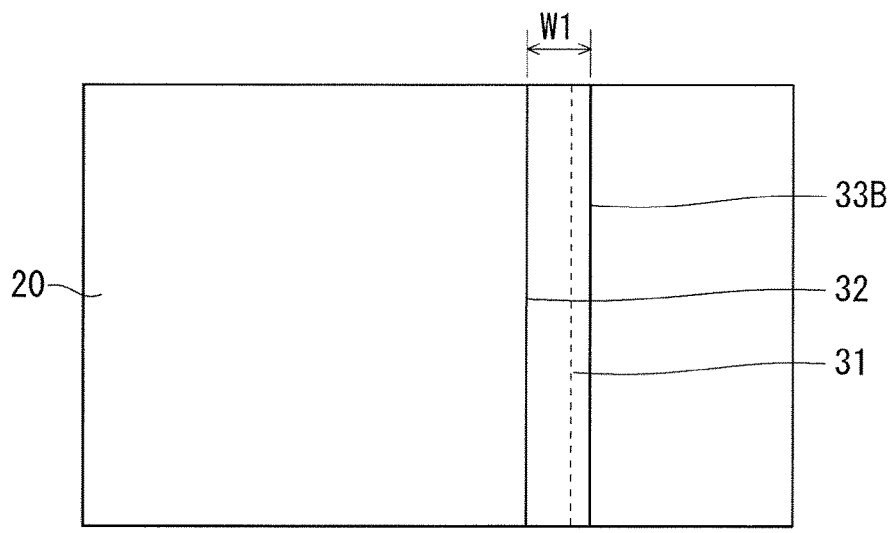

Here, as shown in FIG. 13 and FIG. 14, the transparent cap film 33B is arranged on the low-resistance conductive film 32 such that its edge is positioned on an inner side compared with an edge of the low-reflection film 32, and a distance between an edge of the transparent cap film 33B and the edge of the low-reflection film 32 is represented by W1. In addition, in a case where the distance W1 is zero, it is within an allowable range.

In addition, FIG. 13 and FIG. 14 show a state in which the transparent cap film 33B is arranged such that the edge of the transparent cap film 33B is positioned on an inner side compared with an edge of the low-resistance conductive film 31, but as long as an arrangement relationship with the low-reflection film 32 is satisfied, an arrangement relationship with the low-resistance conductive film 31 is not limited.

Next, a method for manufacturing a display device of the third preferred embodiment according to the present invention will be described with reference to FIG. 15 to FIG. 23.

Figure 15:
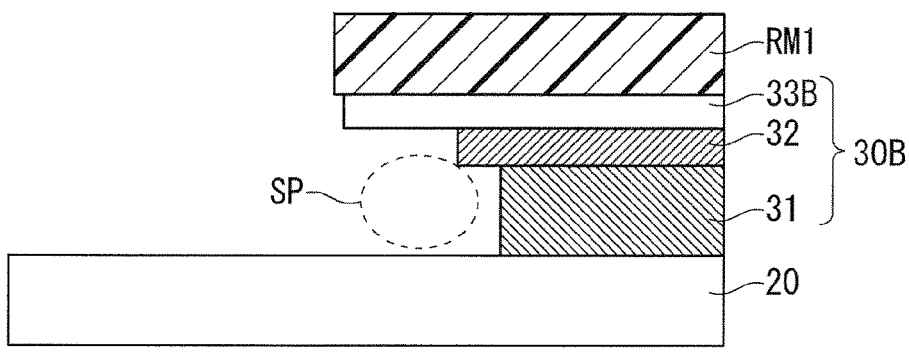
FIG. 15 is a cross-sectional view showing a lower layer wiring just after patterning.

FIG. 15 shows a detailed view of a pattern end in a state after the transparent cap film 33B, the low-reflection film 32, and the low-resistance conductive film 31 are sequentially etched with the resist mask RM1 through the steps described with reference to FIG. 4 to FIG. 6 in the first preferred embodiment.

In this preferred embodiment, it is assumed that the transparent cap film 33B consists of IZO, the low-reflection film 32 consists of an Al nitride alloy having a high degree of nitridation, and the low-resistance conductive film 31 consists of AlNiNd.

The IZO transparent cap film 33B is etched with an oxalic acid solution, and the low-reflection film 32 and the low-resistance conductive film 31 are etched with a mixed acid of phosphoric acid, nitric acid, and acetic acid. Through the above etching, the edges of the low-reflection film 32 and the low-resistance conductive film 31 are positioned on an inner side compared with the edge of the transparent cap film 33B. As a result, as shown by a dotted line in FIG. 15, a space SP is formed under the visor-shaped transparent cap film 33B.

When in this state, the resist mask RM1 is removed, and the lower layer wiring 30B is covered with the interlayer insulating film 21 formed by a CVD method, the problem is that step coverage of the interlayer insulating film 21 is poor, and the upper layer wiring 40 is broken in a part where it climbs over the lower layer wiring 30B.

Figure 16:
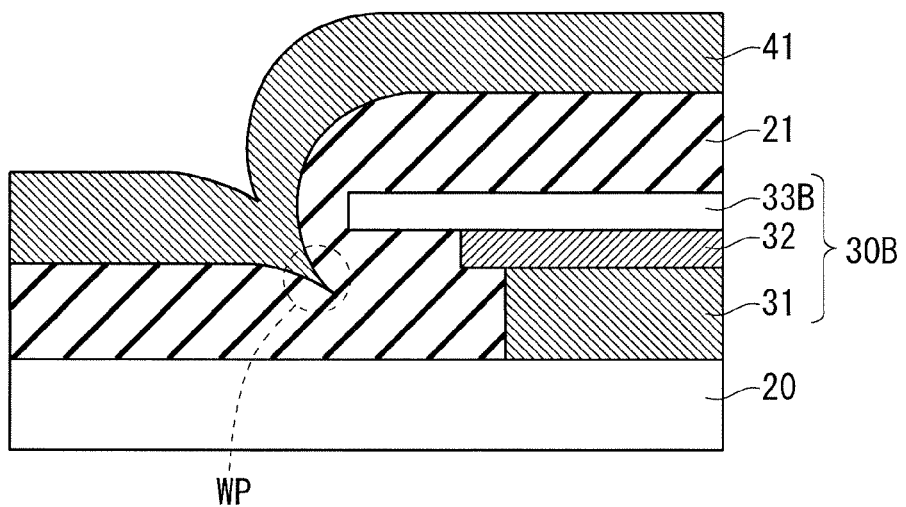
FIG. 16 and FIG. 17 are cross-sectional views for describing a problem in the patterning.

This phenomenon will be schematically described with reference to FIG. 16. As shown in FIG. 16, the interlayer insulating film 21 provided so as to cover the lower layer wiring 30 has a shape which enters the space SP (FIG. 15) provided below the visor-shaped transparent cap film 33B, at a step difference part between the lower layer wiring 30B and the transparent substrate 20. As a result, a depressed part WP is generated in the step difference part. When the low-resistance conductive film 41 of the upper layer wiring 40 is formed on the interlayer insulating film 21 in this state, the low-resistance conductive film 41 enters into the depressed part WP, and a depressed part is also generated in the low-resistance conductive film 41, so that the low-resistance conductive film 41 could be broken at that part.

In addition, the same is true in a case where the interlayer insulating film 21 is formed with the coating type SOG film, and the problem is that a poor coating region is generated due to the presence of the space SP (FIG. 15) provided below the visor-shaped transparent cap film 33B, and the interlayer insulating film 21 cannot be uniformly formed.

Figure 17:
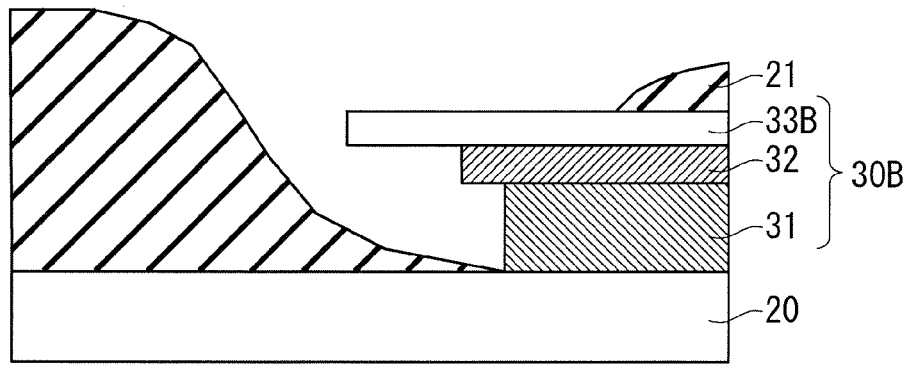

This phenomenon will be schematically described with reference to FIG. 17. As shown in FIG. 17, when a liquid insulating material is coated onto the transparent substrate 20 on which the lower layer wiring 30 is formed, the space SP (FIG. 15) provided below the visor-shaped transparent cap film 33B is not filled with the insulating material, and a poor filling part is generated from the edge part of the lower layer wiring 30 toward the upper part of the transparent cap film 33B. This phenomenon is occasionally called "film cissing", and thus a poor coating region is generated.

Figure 18:
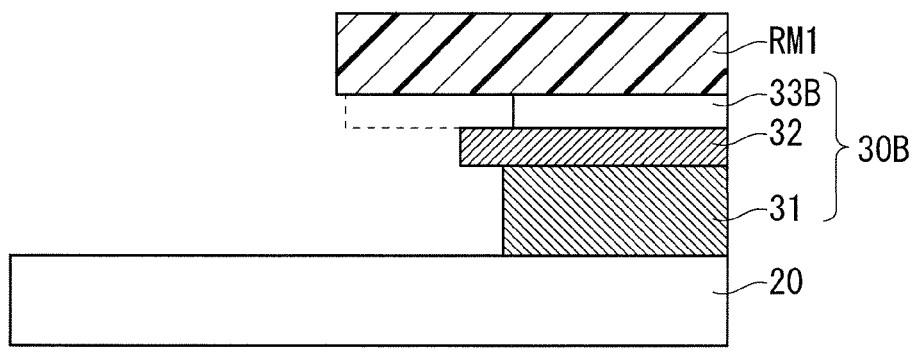
FIG. 18 to FIG. 25 are cross-sectional views for describing steps of manufacturing the touch panel of the third preferred embodiment according to the present invention.

According to this preferred embodiment, in order to prevent the above phenomenon, before the resist mask RM1 is removed, the visor-shaped part of the transparent cap film 33B is removed with an oxalic acid solution as shown in FIG. 18. At this time, an etching time is set so that the edge of the transparent cap film 33B is positioned on an inner side of the wiring compared with the edge of the low-reflection film 32. In FIG. 18, the removed transparent cap film 33B is shown by a dotted line.

Figure 19:
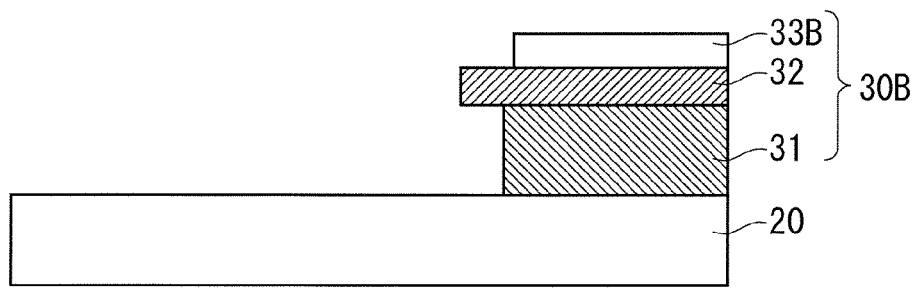

Then, the resist mask RM1 is removed as shown in FIG. 19, and the interlayer insulating film 21 is formed so as to cover the lower layer wiring 30B, so that the lower layer wiring 30B in which the transparent cap film 33B does not project and does not have the visor shape can be provided as shown in FIG. 13.

As a result, the step coverage of the interlayer insulating film 21 covering the lower layer wiring 30B is improved, and the problem that the upper layer wiring 40 is broken at the part where it climbs over the lower layer wiring 30B as described with reference to FIG. 16 is solved, and the poor coating region as described with reference to FIG. 17 is prevented from being generated in the coating type interlayer insulating film.

In addition, in the case where the coating type insulating film is used as the interlayer insulating film, since the large space is not formed at a side wall of the low-resistance conductive film and under the transparent cap film, the poor coating such as film cissing can be prevented from being caused in the poor filling part of the coating film in the space provided below the cap film.

In addition, when the above-described manufacturing method is used, a manufacturing device can be prevented from being contaminated with a foreign material generated when the projecting visor part of the transparent cap film 33B peels off, so that a stable operation can be implemented in a manufacturing line.

Variation

Figure 20:
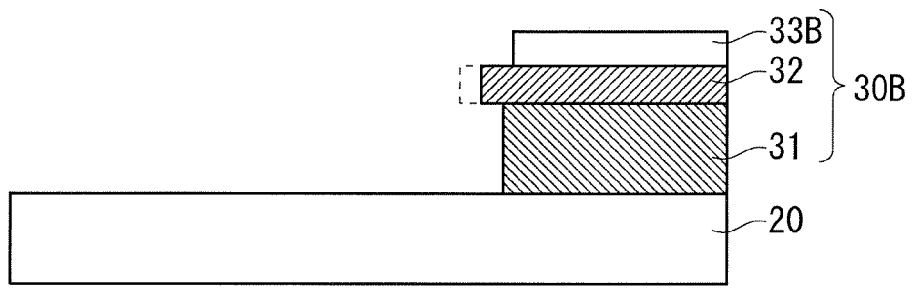

FIG. 20 shows a step of reducing a projection amount of the edge of the low-reflection film 32 positioned on an outer side of the wiring compared with the edge of the low-resistance conductive film 31, by etching the low-reflection film 32 with an alkali solution after the resist mask RM1 is removed.

Figure 21:
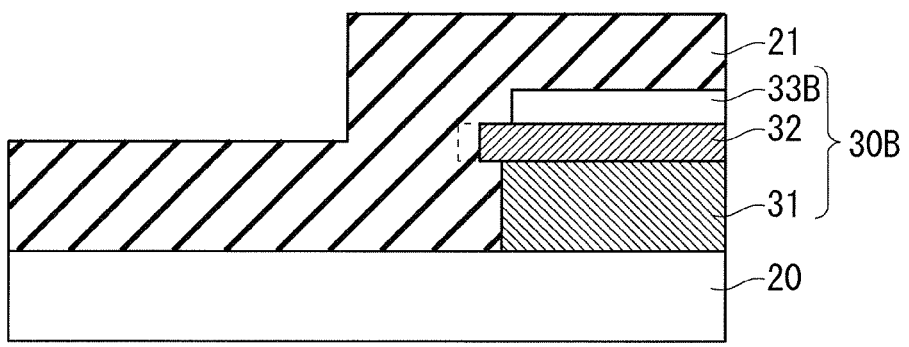

Furthermore, FIG. 21 shows a state provided after the projection amount of the edge of the low-reflection film 32 is reduced, and the interlayer insulating film 21 is formed so as to cover the lower layer wiring 30B, and by reducing the projection amount of the edge of the low-reflection film 32, coverability of the interlayer insulating film can be improved.

However, it is preferable to perform the etching to the extent that the low-reflection film 32 is not etched to the inner side compared with the edge of the transparent cap film 33B.

According to the conventional method, the coating type interlayer insulating film needs to be used in order to prevent the upper layer wiring from being broken, but according to the manufacturing method in this variation, even when the deposition type interlayer insulating film is used, the upper layer wiring can be prevented from being broken. Therefore, the choice of the process is broadened, and the process can be configured so as to be suitable for the manufacturing at low cost.

Figure 22:
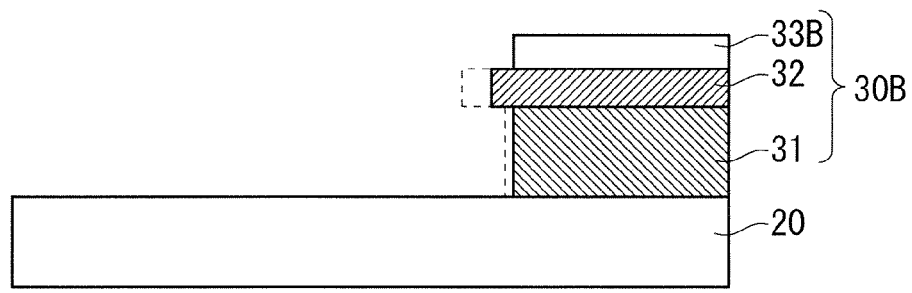

In addition, as shown in FIG. 22, after the resist mask RM1 is removed, the low-reflection film 32 and the low-resistance conductive film 31 may be further etched with a mixed acid of phosphoric acid, nitric acid, and acetic acid to reduce the projection amount of the edge of the low-reflection film 32, and to move the edge position of the low-resistance conductive film 31 toward the inner side of the wiring.

Figure 23:
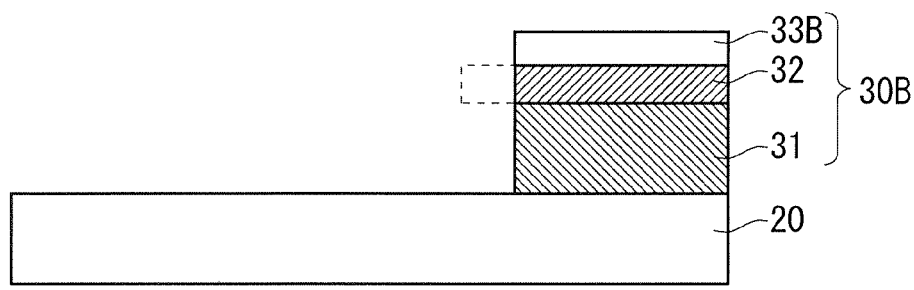

In addition, FIG. 23 shows a step of reducing the projection amount of the edge of the low-reflection film 32 positioned on the outer side of the wiring compared with the edge of the low-resistance conductive film 31 by dry etching, after the resist mask RM1 is removed.

In addition, when the dry etching is used, the edge of the transparent cap film 33B and the edge of the low-reflection film 32 are etched so as to be positioned roughly at the same location, so that it is desirable that the edge of the low-resistance conductive film 31 and the edge of the low-reflection film 32 are also positioned roughly at the same location with a view to reducing reflection and improving coverability of the upper layer insulating film. Therefore, an etching condition such as an etching time is to be set so that the low-reflection film 32 is not etched too much.

This is the same as for the case where etching is performed with a mixed acid as described with reference to FIG. 22. That is, when the low-reflection film 32 is etched too much, and its edge is positioned on the inner side compared with the edge of the transparent cap film 33B, the low-resistance conductive film 31 is also etched in a lateral direction (horizontal direction) with the mixed acid, so that the edge of the transparent cap film 33B projects in the form of a visor. As a result, coverability of the upper layer insulating film is lowered. Therefore, an etching condition such as an etching time is to be set so that the low-reflection film 32 is not etched too much.

In addition, the description has been given of the case where the process for reducing the projection amount of the low-reflection film 32 is performed after the resist mask RM1 on the transparent cap film 33B is removed, but the process may be performed before the removal of the pattern of the resist mask RM1 on the transparent cap film 33B, depending on a method for etching the low-reflection film 32.

Figure 24:
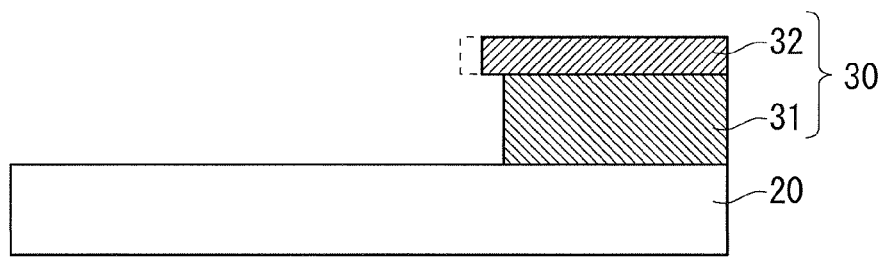

Furthermore, FIG. 24 shows another configuration in which the transparent cap film 33B is removed after the process for reducing the projection amount of the edge of the low-reflection film 32, and thus the lower layer wiring 30 having the laminated structure including the low-reflection film 32 and the low-resistance conductive film 31 is provided.

Figure 25:
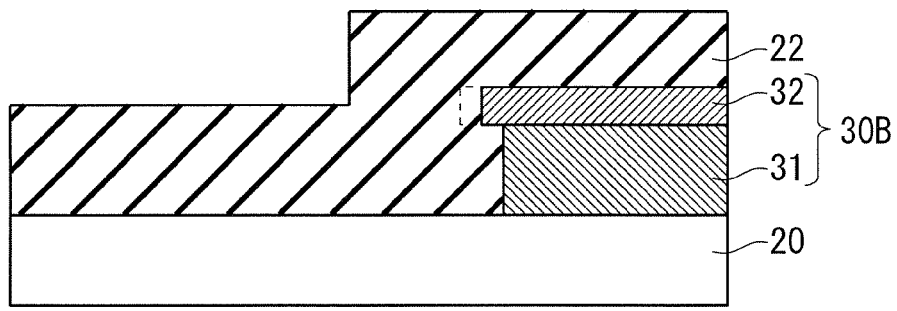

FIG. 25 shows a state in which after the projection amount of the edge of the low-reflection film 32 is reduced and the transparent cap film 33B is removed, the interlayer insulating film 21 is formed so as to cover the lower layer wiring 30, and thus by reducing the projection amount of the edge of the low-reflection film 32, the coverability of the interlayer insulating film can be improved.

In addition, according to the above-described third preferred embodiment and its variation, the process is performed on the lower layer wiring to improve the coverability of the interlayer insulating film, but with a view to preventing the upper layer wiring from being corroded due to water, the same process may be performed on the upper layer wiring so that coverability of the protective film is improved, or the process may be performed on both of the upper layer wiring and the lower layer wiring.

Fourth Preferred Embodiment

Next, a fourth preferred embodiment according to the present invention will be described with reference to FIG. 26 to FIG. 35. FIG. 26 to FIG. 30 are cross-sectional views sequentially showing steps of manufacturing the touch panel 12.

Figure 26:
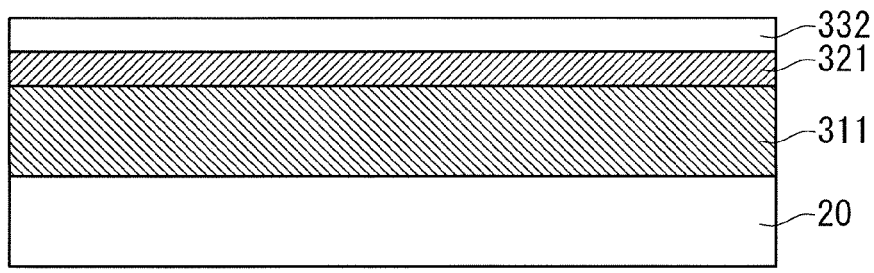
FIG. 26 to FIG. 35 are cross-sectional views for describing steps of manufacturing a touch panel of a fourth preferred embodiment according to the present invention.

First, in a step shown in FIG. 26, the AlNiNd film 311 having a thickness of 300 nm is formed with an AlNiNd target, on the transparent substrate 20 consists of glass or PET, by a sputtering method. Then, in the same film forming equipment, the Al nitride alloy film 321 having a high degree of nitridation and a thickness of 50 nm is formed with the AlNiNd target, on the AlNiNd film 311 in an atmosphere containing $N_2$ gas, by a sputtering method. The degree of nitridation of the Al nitride alloy film may be selected from the same conditions as those of the first preferred embodiment.

Then, a Cr film 332 having a thickness of 10 nm to 30 nm is formed on the Al nitride alloy film 321 by a sputtering method.

In addition, the film is not limited to the Cr film 332 as long as its material satisfies the condition that the Al nitride alloy film 321 and the AlNiNd film 311 can be selectively etched, a reflectivity is 30% or more at the time of film formation, and a reflectivity is 20% or more with respect to a wavelength of a light source for a focusing operation of an exposure apparatus for forming a panel identification symbol (panel ID) after a resist is coated.

Figure 27:
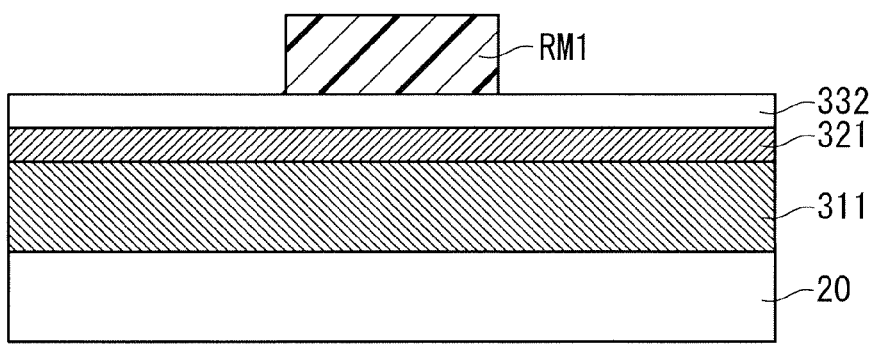

Then, a resist material is coated onto the Cr film 332, and then a pattern of the lower layer wiring is exposed and developed to pattern the resist mask RM1 of the lower layer wiring as shown in FIG. 27. At this time, in addition to the wiring pattern, the panel ID and a substrate identification symbol (substrate ID) are also exposed to be patterned with the exposure apparatus for forming an ID.

Figure 28:
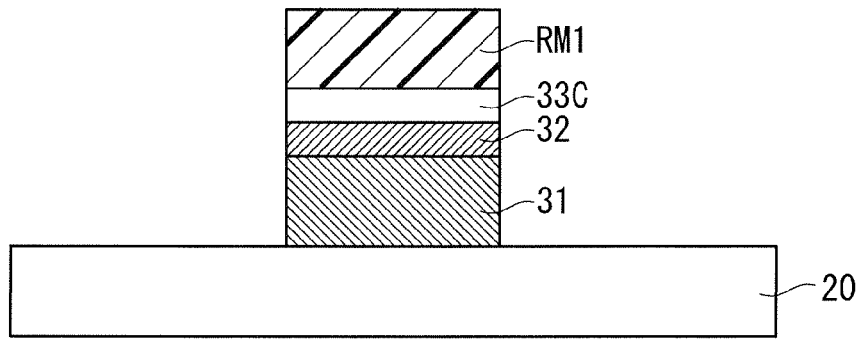

Then, as shown in FIG. 28, the Cr film 332 is etched with a mixed liquid of nitric acid and ceric ammonium nitrate with the resist mask RM1 used as an etching mask to pattern a non-low-reflection cap film 33C. Here, the term "non-low-reflection" means that its reflectivity is higher than a minimum reflectivity at which the exposure apparatus for forming the ID can perform the focusing operation.

In addition, the Cr film 332 positioned at corresponding parts of the panel ID and the substrate ID is etched and patterned, with the resist mask RM1 used as an etching mask.

Then, the Al nitride alloy film 321 and the AlNiNd film 311 are etched with a mixed acid of phosphoric acid, nitric acid, and acetic acid, with the resist mask RM1 and the non-low-reflection cap film 33C used as etching masks, to pattern the low-reflection film 32 and the low-resistance conductive film 31, respectively.

In addition, in a case where the Al nitride alloy film 321 and the AlNiNd film 311 are etched at the same time, the degree of nitridation of the Al nitride alloy film 321 is to be set to the extent that the etching can be performed with the above-described mixed acid.

Figure 29:
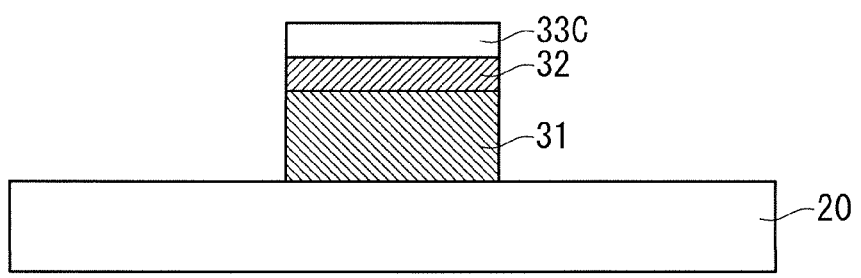
Figure 30:
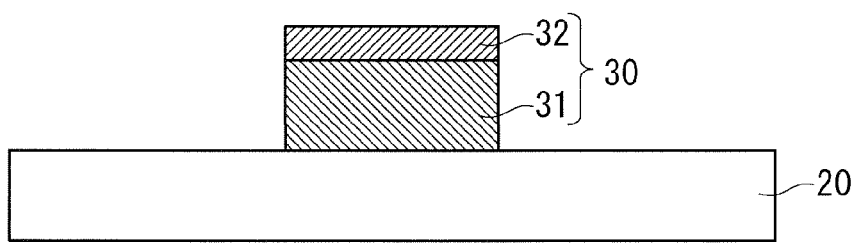

Then, as shown in FIG. 29, the resist mask RM1 is removed with a liquid such as a mixed liquid of monoethanolamine and dimethylsulfoxide, and then the non-low-reflection cap film 33C is removed with, for example, a ceric ammonium nitrate-based liquid, whereby the lower layer wiring 30 shown in FIG. 30 is formed. In addition, at this time, the non-low-reflection cap film provided on the panel ID and the substrate ID is also removed, whereby the panel ID and the substrate ID are formed. Since the following steps are the same as those of the first preferred embodiment, its description is omitted.

In addition, the step of reducing the projection amount of the low-reflection film described in the third preferred embodiment may be added.

Here, in manufacturing the touch panel, after a plurality of touch panels are arranged on one mother substrate, several kinds of steps are performed for the plurality of the touch panels at the same time, and after those steps, the mother substrate is divided to divide the touch panels individually.

In this way, the mother substrate on which the plurality of the touch panels are arranged is called an array substrate, and in the steps with the array substrate, the panel ID and the substrate ID are assigned in order to identify the touch panel and the array substrate, respectively.

The exposure apparatus for forming the ID is different from the exposure apparatus for forming the wiring, and the focusing operation for the substrate is also different from each other in many cases. Therefore, in the case where the wiring pattern having the low-reflection film is formed, even when there is no problem with the focusing operation for the low-reflection film with the exposure apparatus for forming the wiring pattern, it is difficult to perform the focusing operation for the low-reflection film with the exposure apparatus for forming the ID because a reflectivity is low and an intensity of reflected light is low, so that the panel ID and the substrate ID could not be stably formed.

However, according to the manufacturing method of the fourth preferred embodiment, the cap film includes the non-low-reflection film, so that sufficient reflected light can be obtained, and the stable focusing operation can be performed with the exposure apparatus for forming the ID. Therefore, the exposure apparatus can be prevented from being stopped because of a focusing error due to a variation in reflectivity, so that the apparatus can be operated in a stable manner. In addition, since the substrate ID is formed, a manufacturing process of a product can be tracked, so that examination is easily made when a defect is generated, and as a result, a stable manufacturing process can be configured.

Variation

The description has been given of the case where the cap film includes the single layer film in the fourth preferred embodiment described above, but the cap film may include a multilayer film. Hereinafter, a manufacturing method when the cap film includes a multilayer film will be described with reference to FIG. 31 to FIG. 35.

Figure 31:
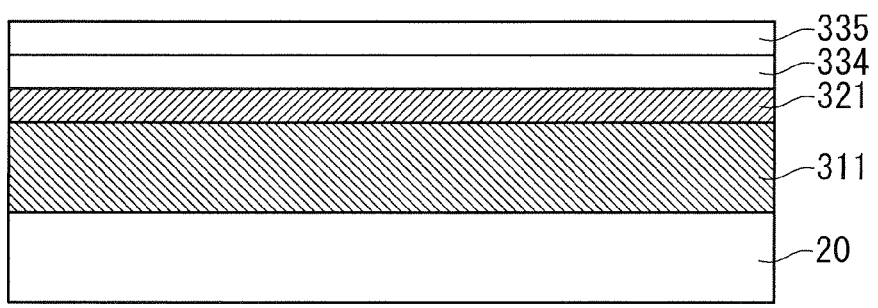

First, in a step shown in FIG. 31, the AlNiNd film 311 having a thickness of 300 nm is formed with an AlNiNd target, on the transparent substrate 20 consists of glass or PET, by a sputtering method. Then, in the same film forming equipment, the Al nitride alloy film 321 having a high degree of nitridation and a thickness of 50 nm is formed with the AlNiNd target, on the AlNiNd film 311 in an atmosphere containing $N_2$ gas, by a sputtering method. The degree of nitridation of the Al nitride alloy film 321 may be selected from the same conditions as those of the first preferred embodiment.

Then, an amorphous ITO film 334 is formed on the Al nitride alloy film 321 by a sputtering method. In addition, instead of a sputtering method, a method such as coating may be used.

Then, a Mo film 335 having a thickness of 10 nm to 30 nm is formed on the ITO film 334 by a sputtering method.

Figure 32:
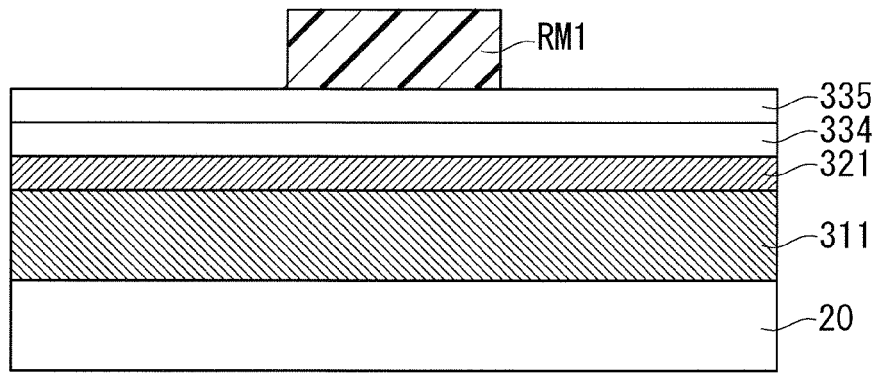

Then, a resist material is coated onto the Mo film 335, and a pattern of the lower layer wiring is exposed and developed to pattern the resist mask RM1 of the lower layer wiring as shown in FIG. 32. At this time, in addition to the wiring pattern, the panel ID and the substrate identification symbol (substrate ID) are exposed and patterned with the exposure apparatus for forming an ID.

Figure 33:
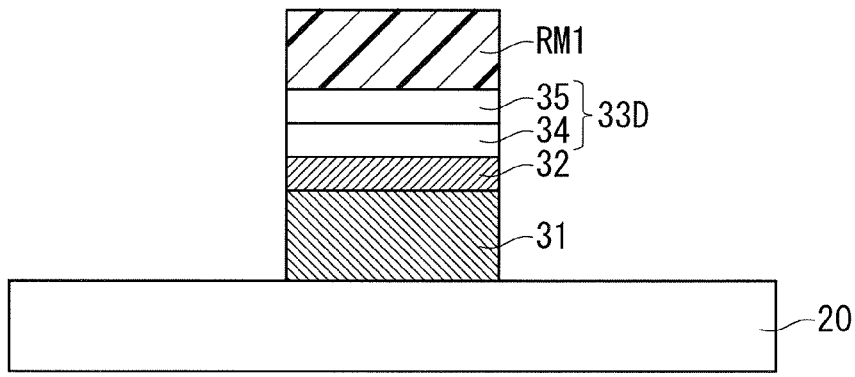

Then, as shown in FIG. 33, the Mo film 335 is etched with a mixed acid of phosphoric acid, nitric acid, and acetic acid, with the resist mask RM1 used as an etching mask to pattern a non-low-reflection film 35. Then, the ITO film 334 is etched with an oxalic acid solution, with the resist mask RM1 and the non-low-reflection film 35 used as etching masks to pattern a transparent film 34.

Then, the Al nitride alloy film 321 and the AlNiNd film 311 are etched with a mixed acid of phosphoric acid, nitric acid, and acetic acid, with the resist mask RM1, the non-low-reflection film 35, and the transparent film 34 used as etching masks, to pattern the low-reflection film 32 and the low-resistance conductive film 31, respectively.

In addition, in a case where the Al nitride alloy film 321 and the AlNiNd film 311 are etched at the same time, the degree of nitridation of the Al nitride alloy film 321 is to be set to the extent that the etching can be performed with the above-described mixed acid.

Figure 34:
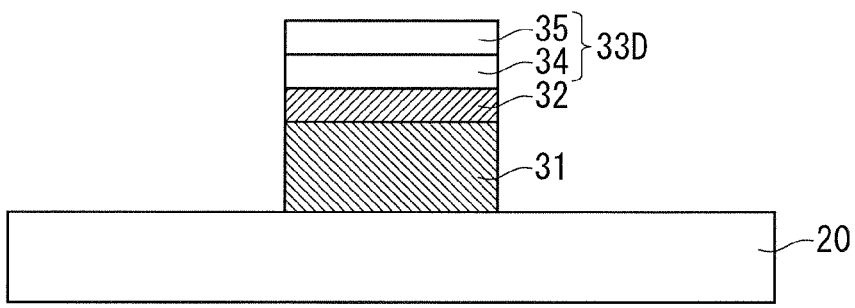

Then, as shown in FIG. 34, after the resist mask RM1 is removed with a liquid such as a mixed liquid of monoethanolamine and dimethylsulfoxide, a cap film 33D including the non-low-reflection film 35 and the transparent film 34 is provided.

Figure 35:
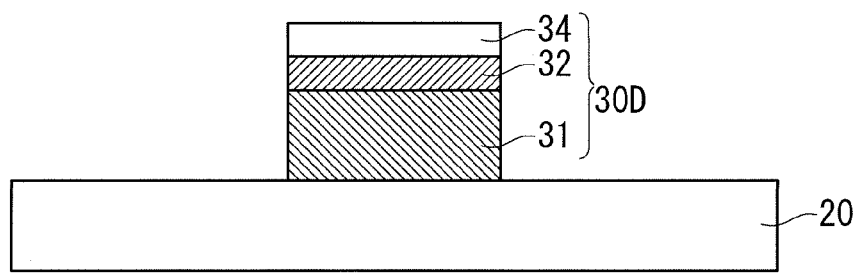

Then, as shown in FIG. 35, the non-low-reflection film 35 is removed with, for example, a mixed acid of phosphoric acid, nitric acid, and acetic acid, whereby a lower layer wiring 30D is formed. In addition, at this time, the panel ID and the substrate ID are formed by removing the non-low-reflection film on the panel ID and the substrate ID. Since the following steps are the same as those of the first preferred embodiment, its description is omitted.

The transparent film 34 covers the wiring pattern when the non-low-reflection film 35 is removed by etching, so that they do not disappear although the low-reflection film 32 and the low-resistance conductive film 31 are etched in the lateral direction (horizontal direction) according to an etching time.

In addition, the process for reducing the projection amounts of the transparent cap film and the low-reflection film described in the third preferred embodiment may be added.

However, according to this preferred embodiment, even when the process for reducing the projection amount of the transparent cap film is performed, there is a case where the edge of the low-reflection film is positioned on an inner side compared with the transparent cap film, depending on an etching amount at the time of removing the non-low-reflection cap film, so that it is preferable to select a material and a method for forming the interlayer insulating film so that high coverability can be provided.

In addition, the non-low-reflection cap film is preferably as thin as possible in order to reduce the etching time for removing the non-low-reflection cap film to the extent that the reflectivity thereof can be ensured.

In addition, as shown in the second preferred embodiment, the wiring structure in which the transparent cap film is left on the low-reflection film may be employed.

According to the manufacturing method implemented with the above multilayer cap film, the non-low-reflection cap film can be formed of a material which can be selected from the materials used in a manufacturing line, without regard to etching selectivity with respect to the Al nitride alloy film serving as the low-reflection film and the low-resistance conductive film, so that the line can be configured at low costs.

In addition, while the present invention is applied to the wiring of the touch panel in the above-described first to fourth preferred embodiments, it may be applied to a wiring of a liquid crystal display, and may also be applied to a light-blocking layer for reducing reflection on a display surface side of the liquid crystal display.

In addition, according to the present invention, the above preferred embodiments can be arbitrarily combined, or each preferred embodiment can be appropriately deformed or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A display device comprising
a display region including:
a laminated wiring comprising a conductive film, a metal nitride film mainly containing Al and functioning as a reflection preventing film, and a transparent film functioning as a protection film which are sequentially laminated in this order on a base layer; and
an insulating film formed so as to cover said laminated wiring, wherein
said insulating film side is a display surface side.

2. A display device comprising:
a laminated wiring comprising a conductive film, a metal nitride film mainly containing Al and functioning as a reflection preventing film, and a transparent film functioning as a protection film which are sequentially laminated in this order on a base layer; and
an insulating film formed so as to cover said laminated wiring, wherein
said insulating film side is a display surface side, and
said transparent film is arranged on said metal nitride film in such a manner that an edge of said transparent film is vertically aligned with an edge of said metal nitride film in a side, cross-sectional view, or
said transparent film is arranged on said metal nitride film in such a manner that an inner side of said transparent film is horizontally displaced compared with an edge of said metal nitride film, in a side, cross-sectional view, and said metal nitride film extends horizontally further than said transparent film in a side, cross-sectional view.

3. The display device according to claim 1, wherein
said transparent film has a refractive index higher than that of said insulating film.

4. The display device according to claim 3, wherein
said transparent film consists of a material having a refractive index of 1.7 to 2.4, and having a film thickness of 30 nm to 70 nm.

5. The display device according to claim 1, wherein
an end part of said laminated wiring is used as a terminal part for being electrically connected to an outside, and
said terminal part has an opening reaching said conductive film through said insulating film, said transparent film, and said metal nitride film.

6. The display device according to claim 1, wherein
said laminating wirings is set so as to form a film thickness of said metal nitride film in such a manner that a ratio of a minimum film thickness to a maximum film thickness (minimum film thickness/maximum film thickness) exceeds 0.6.

7. The display device according to claim 1, wherein
said display device comprises a projected capacitive touch panel, and
said laminated wiring serves as a detecting wiring for detecting electrostatic capacity in said touch panel.

8. The display device according to claim 1, wherein
a degree of nitridation of said metal nitride film is 30 at. % to 50 at. % as a composition ratio of nitrogen.

9. The display device according to claim 1, wherein
said transparent film consists of one of IZO, ITO, SnO, ZnO, InO, $SiO_2$, SiN, $Al_2O_3$, TaO, NbO, and TiO.

* * * * *